(12) United States Patent
Smith et al.

(10) Patent No.: US 8,697,982 B2
(45) Date of Patent: Apr. 15, 2014

(54) LIGHT-EMITTING POLYMER

(71) Applicant: LEP America, Incorporated, Bloomfield Hills, MI (US)

(72) Inventors: James W. Smith, Toronto (CA); Bruce McKague, Toronto (CA)

(73) Assignee: LEP America, Incorporated, Bloomfield Hills, MI (US)

( * ) Notice: Subject to any disclaimer, the term of this patent is extended or adjusted under 35 U.S.C. 154(b) by 0 days.

(21) Appl. No.: 14/064,400

(22) Filed: Oct. 28, 2013

(65) Prior Publication Data

US 2014/0048127 A1    Feb. 20, 2014

Related U.S. Application Data

(62) Division of application No. 13/391,450, filed as application No. PCT/US2010/046276 on Aug. 23, 2010, now Pat. No. 8,569,610.

(60) Provisional application No. 61/235,729, filed on Aug. 21, 2009.

(51) Int. Cl.
*H01L 27/30* (2006.01)
*C09K 11/04* (2006.01)
*C08G 77/388* (2006.01)

(52) U.S. Cl.
USPC . 136/244; 136/257; 252/301.17; 252/301.35; 252/646

(58) Field of Classification Search
None
See application file for complete search history.

(56) References Cited

U.S. PATENT DOCUMENTS

| | | | | |
|---|---|---|---|---|
| 4,461,876 A | * | 7/1984 | Lieberman et al. | 525/374 |
| 4,997,597 A | * | 3/1991 | Clough et al. | 252/646 |
| 5,110,500 A | * | 5/1992 | Walker | 252/301.16 |
| 5,658,494 A | * | 8/1997 | Bell et al. | 252/301.18 |

* cited by examiner

*Primary Examiner* — Robert S Loewe
(74) *Attorney, Agent, or Firm* — Carlson, Gaskey & Olds, P.C.

(57) ABSTRACT

A radiation-emitting polymer composition includes a polysiloxane polymer including tritium and a wavelength-shifter chemically bonded as a side chain to the polysiloxane polymer or chemically bonded as a side chain to a siloxane carrier dispersed within the polysiloxane polymer. The wavelength-shifter includes a plurality of cyclic chemical moieties and emits electromagnetic radiation in response to radiation emitted by the tritium.

12 Claims, 1 Drawing Sheet

LIGHT-EMITTING POLYMER

RELATED APPLICATIONS

This is a divisional application of U.S. patent application Ser. No. 13/391,450, filed on Oct. 2, 2011, which is a United States National Phase of PCT Application No. PCT/US10/46276, filed on Aug. 23, 2010, which claims priority to U.S. Provisional Application No. 61/235,729, filed on Aug. 21, 2009.

BACKGROUND OF THE INVENTION

This disclosure relates to light-emitting polymers for use as light or energy sources.

Light-emitting polymers are known and used for self-illuminated signs, "nuclear" batteries, and the like. As an example, conventional light-emitting polymers may be formed from polystyrene and labeled with tritium that emits radiation, such as beta particles. The polymer is doped with a scintillator, such as a phosphor, that emits visible light when irradiated with the radiation from the tritium. That is, the light-emitting polymer is self-illuminating and may be used for signs or with photovoltaic devices to generate electric current.

SUMMARY

A radiation-emitting polymer composition includes a polysiloxane polymer including tritium and a wavelength-shifter chemically bonded as a side chain to the polysiloxane polymer or chemically bonded as a side chain to a siloxane carrier dispersed within the polysiloxane polymer. The wavelength-shifter includes a plurality of cyclic chemical moieties and emits electromagnetic radiation in response to radiation emitted by the tritium.

Also disclosed is an energy source that includes an electromagnetic radiation-emitting polymer having a polysiloxane polymer that includes tritium and a wavelength-shifter chemically bonded as a side chain to the polysiloxane polymer or chemically bonded as a side chain includes a plurality of cyclic chemical moieties and emits electromagnetic radiation in response to radiation emitted by the tritium. An electromagnetic-responsive device is adjacent to the electromagnetic radiation-emitting polymer and is operable to provide an electric current in response to the electromagnetic radiation.

BRIEF DESCRIPTION OF THE DRAWINGS

The various features and advantages of the disclosed examples will become apparent to those skilled in the art from the following detailed description. The drawings that accompany the detailed description can be briefly described as follows.

DETAILED DESCRIPTION OF THE PREFERRED EMBODIMENT

Figure 1:
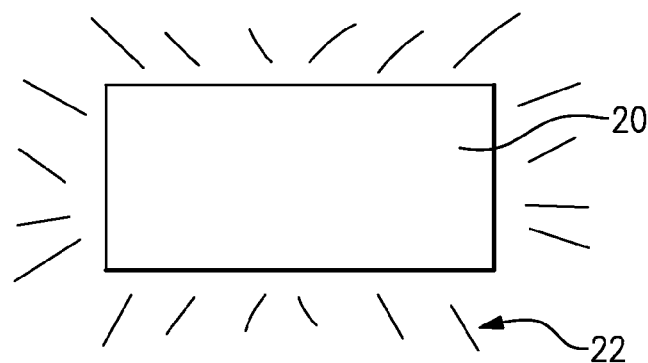
FIG. 1 illustrates an example light-emitting polymer.

FIG. 1 illustrates selected portions of an example light-emitting polymer 20, which may be used as a light source or an energy source for providing electric current, as will be described later in this description. One premise of this disclosure is that the exemplary light-emitting polymer 20 provides greater stability than previously known light-emitting polymers and is more efficient in generating light. The term "light," "illuminate" and variations thereof as used in this disclosure may refer to all forms of electromagnetic radiation, such as ultraviolet and visible radiation, and are not limited to electromagnetic radiation within the visible wavelength spectrum.

As indicated above, the light-emitting polymer 20 emits light 22 and is thereby self-illuminating. For instance, the light-emitting polymer 20 includes polysiloxane with tritium bonded thereto that emits radiation, such as beta particles. A wavelength-shifter may be chemically bonded to the polysiloxane polymer. The wavelength-shifter emits light, such as ultraviolet or visible light, in response to the radiation emitted from the tritium. The polysiloxane polymer may also include other additives, depending upon the intended use of the light-emitting polymer 20, such as cross-linking agents, plasticizers, anti-oxidants, and the like.

The polysiloxane is durable and less susceptible to cross-linking or degradation from the emitted radiation than prior light-emitting polymers. For instance, former light-emitting polymers based on polystyrene exhibit limited durability because the radiation causes cross-linking and "color centers" that reduce light emission. In comparison, the radiation does not cause significant cross-linking or "color centers" in polysiloxane and the disclosed light-emitting polymer 20 may thereby exhibit little reduction in functionality over a period of at least several years.

In the illustrated example, the wavelength-shifter is chemically bonded to the polysiloxane polymer. In other words, the wavelength-shifter is not merely doped into or mixed with the polymer but is instead chemically bonded to the polymer monomer. The wavelength-shifter has limited solubility within the polysiloxane polymer if physically mixed with the polymer or doped into the polymer. Thus, chemically bonding the wavelength-shifter to the polysiloxane polymer avoids the solubility limitation and thereby allows a greater amount of the wavelength shifter to be incorporated into the light-emitting polymer 20. The light-emitting polymer 20 is thereby capable of more efficiently converting the radiation emitted from the tritium into light.

In one example, chemically bonding the wavelength-shifter to the polysiloxane polymer permits a concentration of wavelength-shifter of approximately 0.015 gram/gram in the polysiloxane. In one specific example, the concentration of wavelength-shifter may be about 0.75 grams in about 50 grams of polysiloxane.

The tritium may alternatively be incorporated into the light-emitting polymer 20 through use of a tritium carrier. The tritium carrier may be the reaction product of divinyltetraphenyldisiloxane with tritium. An example of this reaction is shown below in equation 1.

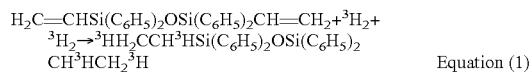

$$H_2C=CHSi(C_6H_5)_2OSi(C_6H_5)_2CH=CH_2 + {}^3H_2 +$$
$$\phantom{H_2C=CHSi}{}^3H_2 \rightarrow {}^3HH_2CCH^3HSi(C_6H_5)_2OSi(C_6H_5)_2$$
$$\phantom{H_2C=CHSi}CH^3HCH_2{}^3H \qquad \text{Equation (1)}$$

The tritium carrier may then be mixed with a siloxane monomer, which is then polymerized in a known manner to form the light-emitting polymer 20. The tritium carrier is not chemically bonded to the polysiloxane polymer but is compatible with the polymer through the use of the same chemical side groups on the siloxane monomer and on the carrier. In this case, each of the siloxane monomer and the carrier may include phenyl groups and siloxane groups for compatibility. Thus, the carrier may bind to the polysiloxane through secondary bonding that involves attraction between the chemical side groups.

The wavelength-shifter may be any type of wavelength-shifter that is suitable for chemically bonding with the polysiloxane polymer, or siloxane monomer during a preparation stage of the light-emitting polymer 20. As an example, the wavelength-shifter may be 1-phenyl-3-mesityl-2-pyrazoline, or PMP. An example structure of a PMP molecule is shown below as wavelength-shifter 1.

Wavelength-Shifter 1 10

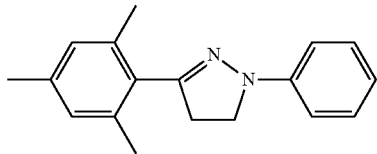

In one modification, the PMP molecule may include additional side groups that may facilitate compatibility with the polysiloxane polymer or reaction with the siloxane monomer to attach the wavelength-shifter to the monomer. As an example, the structure of an example modified PMP is shown below as wavelength-shifter 2.

Wavelength-Shifter 2

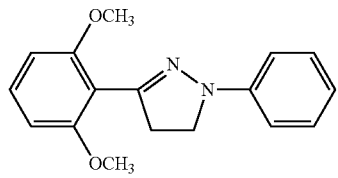

In one example of the preparation of the light-emitting polymer 20, a siloxane monomer and the desired additives may be mixed with the tritium carrier and the selected wavelength-shifter to bond the wavelength-shifter to the siloxane monomer. The wavelength-shifter reacts with the siloxane monomer to replace one of the phenyl groups or attach to one of the phenyl groups in a chemical bond. The mixture may be heated to facilitate the reaction and known laboratory or manufacturing equipment may be utilized to carry out the preparation. An example of the preparation of a wavelength-shifter 1 bonded to the polysiloxane is shown below, where m and n are each integers greater than or equal to one.

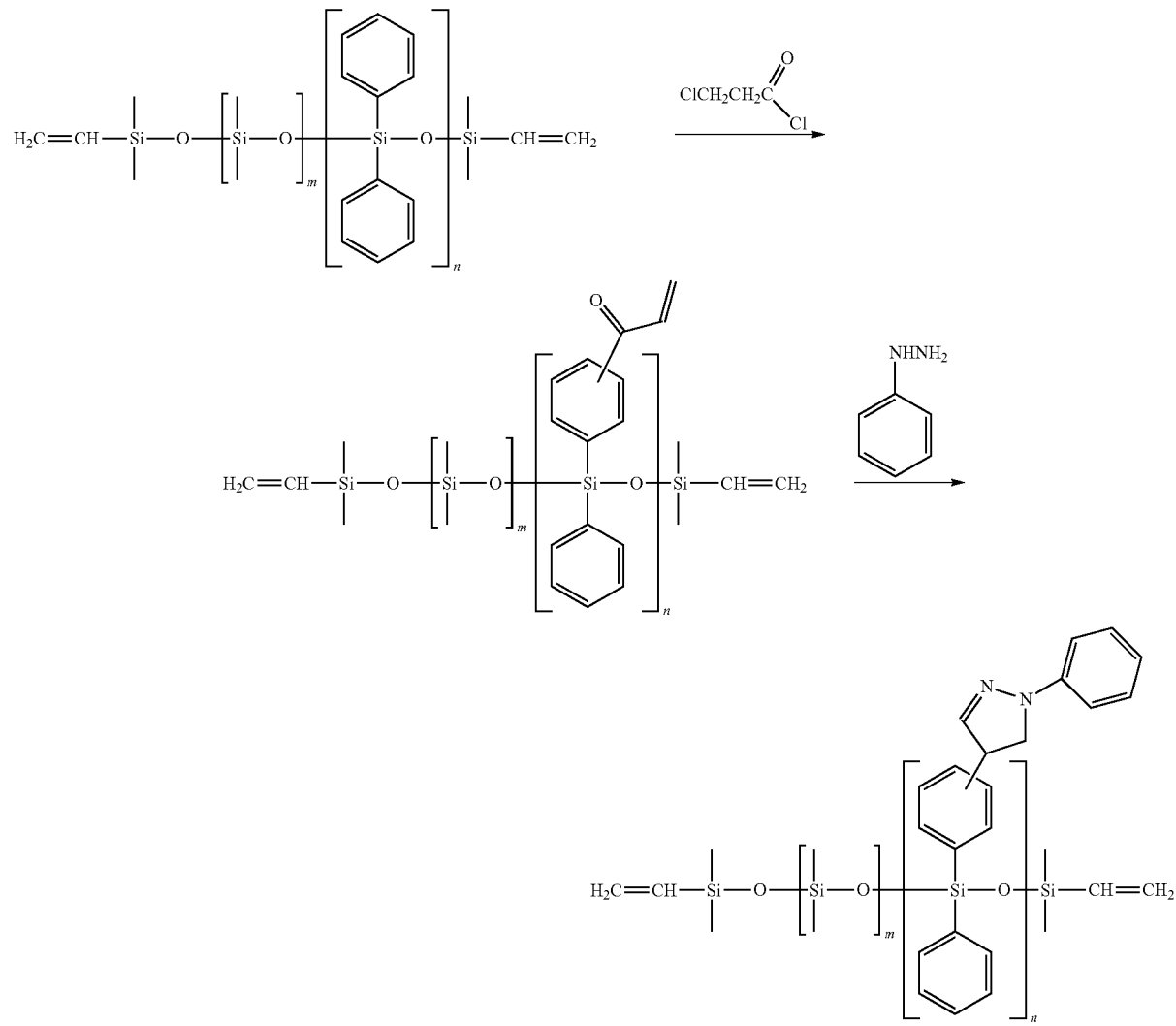

The siloxane monomer may also be selected for compatibility with the wavelength-shifter. As an example, the siloxane monomer may include one or more side groups that function as reaction sites for chemically reacting with the wavelength-shifter to bond the wavelength-shifter to the polysiloxane backbone. The siloxane monomer structure illustrated below, a phenylsiloxane, may be used in combination with the above wavelength-shifters to form the light-emitting polymer 20 as tritiated polyphenylsiloxane.

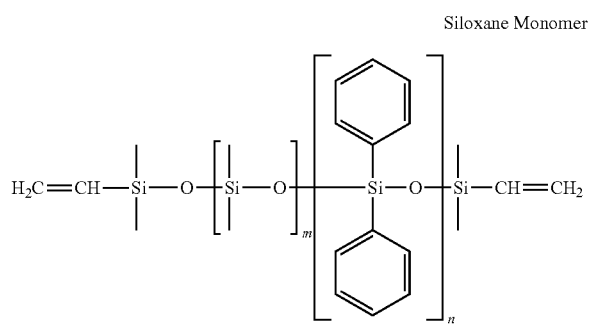

Siloxane Monomer

Alternatively, or in addition to bonding the wavelength-shifter to the polysiloxane backbone, the wavelength-shifter may be chemically bonded to a siloxane carrier that is then dispersed within the polysiloxane polymer. In one example of the preparation of the light-emitting polymer 20, a siloxane monomer and the bonded wavelength-shifter/siloxane carrier are mixed together with the tritium carrier to disperse the bonded wavelength-shifter/siloxane carrier uniformly throughout the polysiloxane polymer. The mixture may be heated to facilitate the process and known laboratory or manufacturing equipment may be utilized to carry out the preparation.

As an example, the bonded wavelength shifter/siloxane carrier form the chemical structure shown below (where WS is the wavelength-shifter):

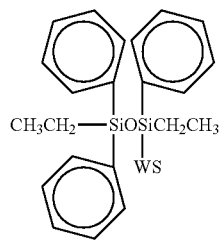

In another example where the wavelength-shifter is chemically bonded to the siloxane carrier, the wave-length shifter/siloxane carrier form the chemical structure below (where WS is the wavelength-shifter):

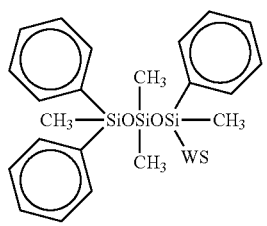

Figure 2:
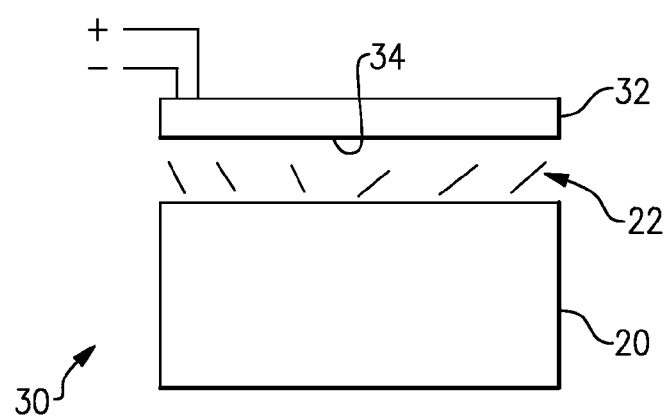
FIG. 2 illustrates an example energy source that includes a light-emitting polymer.

FIG. 2 illustrates one example implementation of the light-emitting polymer 20 in an energy source 30 for generating electric current. In this example, the light-emitting polymer 20 is located adjacent to a photoelectric device 32, such as a photovoltaic cell or photocell. The light 22 emitted from the light-emitting polymer 20 impinges upon a light-receiving surface 34 of the photoelectric device 32, which converts the light into electrical energy. In this case, the photoelectric device 32 is shown in a spaced arrangement relative to the light-emitting polymer 20 and only on one side of the light-emitting polymer 20. However, in other examples, the photoelectric device 32 may be in intimate contact with the light-emitting polymer 20 or designed to surround the light-emitting polymer 20 such that the photoelectric device 32 receives light emitted from all sides of the light-emitting polymer 20. Thus, the illustrated arrangement may be adapted to suit the particular needs of an intended application.

Additionally, the photoelectric device 32 may be any type of photoelectric device or array for receiving the light 22 and converting the light 22 into electrical energy. For instance, the photoelectric device 32 may include specialized photocells that are adapted for absorbing light within a specific wavelength range to efficiently convert the light 22 into electrical energy.

In some examples, the light-emitting polymer 20 may exclude a scintillant or wavelength-shifter and rely on the chemical side groups of the polysiloxane polymer, such as the phenyl groups, to convert the radiation emitted from the tritium into light. In this case, the light 22 emitted may be in the ultraviolet wavelength range and the photoelectric device 32 may therefore be adapted to convert ultraviolet radiation into electrical energy. In this regard, the photoelectric device 32 may include quantum dot photocells for absorbing light 22 within the ultraviolet wavelength range.

Although a combination of features is shown in the illustrated examples, not all of them need to be combined to realize the benefits of various embodiments of this disclosure. In other words, a system designed according to an embodiment of this disclosure will not necessarily include all of the features shown in any one of the Figures or all of the portions schematically shown in the Figures. Moreover, selected features of one example embodiment may be combined with selected features of other example embodiments.

The preceding description is exemplary rather than limiting in nature. Variations and modifications to the disclosed examples may become apparent to those skilled in the art that do not necessarily depart from the essence of this disclosure.

What is claimed is:

1. A radiation-emitting polymer composition comprising:
   a polysiloxane polymer including tritium; and
   a wavelength-shifter chemically bonded as a side chain to the polysiloxane polymer or chemically bonded as a side chain to a siloxane carrier dispersed within the polysiloxane polymer, the wavelength-shifter including a plurality of cyclic chemical moieties and emitting electromagnetic radiation in response to radiation emitted by the tritium.

2. The light-emitting polymer composition as recited in claim 1, wherein a concentration of the wavelength-shifter in the polysiloxane polymer is approximately 0.015 gram/gram.

3. The light-emitting polymer composition as recited in claim 1, further comprising a tritium carrier bonded with the tritium, and the tritium carrier is divinyltetraphenyldisiloxane.

4. The light-emitting polymer composition as recited in claim 1, wherein the wavelength-shifter is chemically bonded to the siloxane carrier, and the siloxane polymer and the siloxane carrier each comprise phenyl groups.

5. The light-emitting polymer composition as recited in claim 1, wherein the wavelength-shifter comprises 1-phenyl-3-mesityl-2-pyrazoline.

6. The light-emitting polymer composition as recited in claim 1, wherein the wavelength-shifter comprises:

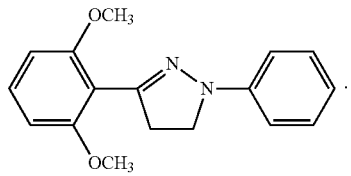

7. The light-emitting polymer composition as recited in claim 1, wherein the wavelength-shifter is chemically bonded to the polysiloxane polymer to form:

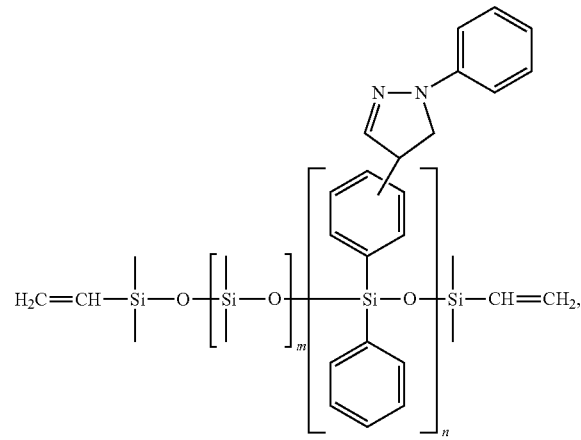

wherein m and n are each integers greater than or equal to 1.

8. The light-emitting polymer composition as recited in claim 1, wherein the polysiloxane polymer is a polyphenylsiloxane.

9. The light-emitting polymer composition as recited in claim 1, wherein the wavelength-shifter is chemically bonded to the siloxane carrier to form:

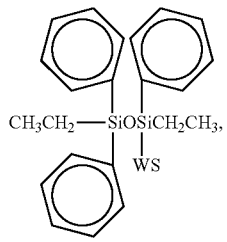

wherein WS is the wavelength-shifter.

10. The light-emitting polymer composition as recited in claim 1, wherein the wavelength-shifter is chemically bonded to the siloxane carrier to form:

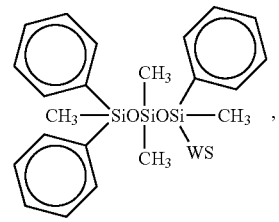

wherein WS is the wavelength-shifter.

11. An energy source comprising:
an electromagnetic radiation-emitting polymer comprising a polysiloxane polymer including tritium and a wavelength-shifter chemically bonded as a side chain to the polysiloxane polymer or chemically bonded as a side chain to a siloxane carrier dispersed within the polysiloxane polymer, the wavelength-shifter including a plurality of cyclic chemical moieties and emitting electromagnetic radiation in response to radiation emitted by the tritium; and
an electromagnetic-responsive device adjacent to the electromagnetic radiation-emitting polymer and operable to provide an electric current in response to the electromagnetic radiation.

12. The energy source as recited in claim 11, wherein the electromagnetic-responsive device comprises quantum dot photocells for absorbing light within an ultraviolet wavelength range.

* * * * *